(12) United States Patent
Starkovich et al.

(10) Patent No.: US 10,180,288 B2
(45) Date of Patent: Jan. 15, 2019

(54) HIGH-CONDUCTIVITY BONDING OF METAL NANOWIRE ARRAYS

(71) Applicants: Northrop Grumman Systems Corporation, Falls Church, VA (US); The Board of Trustees of the Leland Stanford Junior University, Stanford, CA (US)

(72) Inventors: John A. Starkovich, Redondo Beach, CA (US); Edward M. Silverman, Encino, CA (US); Jesse B. Tice, Torrance, CA (US); Hsiao-Hu Peng, Rancho Palos Verdes, CA (US); Michael T. Barako, Gettysburg, PA (US); Kenneth E. Goodson, Portola Valley, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 15/422,602

(22) Filed: Feb. 2, 2017

(65) Prior Publication Data

US 2017/0146302 A1 May 25, 2017

Related U.S. Application Data

(62) Division of application No. 15/249,535, filed on Aug. 29, 2016, which is a division of application No. (Continued)

(51) Int. Cl.
*H01L 23/00* (2006.01)
*F28F 3/02* (2006.01)
(Continued)

(52) U.S. Cl.
CPC ............ *F28F 3/022* (2013.01); *B23K 1/0012* (2013.01); *B23K 20/023* (2013.01); *B23P 15/26* (2013.01);
(Continued)

(58) Field of Classification Search
None
See application file for complete search history.

(56) References Cited

U.S. PATENT DOCUMENTS

| 5,367,282 | A | * | 11/1994 | Clem | ........................ | G01K 1/08 338/22 R |
| 2005/0211461 | A1 | * | 9/2005 | Horikoshi | ................ | C25D 5/10 174/117 FF |

FOREIGN PATENT DOCUMENTS

| JP | 2004-128103 | | 4/2004 |
| JP | 2004128103 | A * | 4/2004 |

* cited by examiner

*Primary Examiner* — Kiley S Stoner
(74) *Attorney, Agent, or Firm* — Patti & Malvone Law Group, LLC

(57) ABSTRACT

A thermally-conductive and mechanically-robust bonding method for attaching a metal nanowire (MNW) array to an adjacent surface includes the steps of: removing a template membrane from the MNW; infiltrating the MNW with a bonding material; placing the bonding material on the adjacent surface; bringing an adjacent surface into contact with a top surface of the MNW while the bonding material is bondable; and allowing the bonding material to cool and form a solid bond between the MNW and the adjacent surface. A thermally-conductive and mechanically-robust bonding method for attaching a metal nanowire (MNW) array to an adjacent surface includes the steps of: choosing a bonding material based on a desired bonding process; and without removing the MNW from a template membrane that (Continued)

fills an interstitial volume of the MNW, depositing the bonding material onto a tip of the MNW.

1 Claim, 3 Drawing Sheets

Related U.S. Application Data

15/006,658, filed on Jan. 26, 2016, now Pat. No. 9,468,989.

(60) Provisional application No. 62/121,010, filed on Feb. 26, 2015.

(51) Int. Cl.
*B23K 1/00* (2006.01)
*B23K 20/02* (2006.01)
*C25D 3/30* (2006.01)
*C25D 3/48* (2006.01)
*C25D 5/02* (2006.01)
*C25D 5/48* (2006.01)
*C25D 7/06* (2006.01)
*C25D 9/02* (2006.01)
*B82Y 30/00* (2011.01)
*H01L 23/373* (2006.01)
*B23P 15/26* (2006.01)
*B23K 101/14* (2006.01)

(52) U.S. Cl.
CPC ............... *B82Y 30/00* (2013.01); *C25D 3/30* (2013.01); *C25D 3/48* (2013.01); *C25D 5/02* (2013.01); *C25D 5/48* (2013.01); *C25D 7/0607* (2013.01); *C25D 9/02* (2013.01); *H01L 23/373* (2013.01); *H01L 23/3736* (2013.01); *H01L 23/3737* (2013.01); *H01L 24/27* (2013.01); *H01L 24/29* (2013.01); *H01L 24/83* (2013.01); *B23K 2101/14* (2018.08); *F28F 2255/20* (2013.01); *H01L 2224/27462* (2013.01); *H01L 2224/27466* (2013.01); *H01L 2224/29078* (2013.01); *H01L 2224/29211* (2013.01); *H01L 2224/29244* (2013.01); *H01L 2224/83203* (2013.01); *H01L 2224/83232* (2013.01); *H01L 2224/83238* (2013.01)

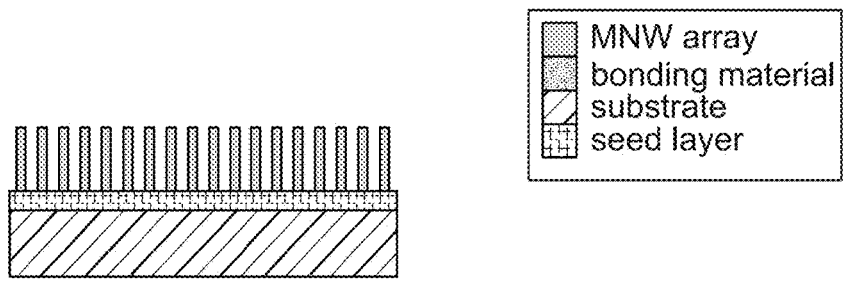
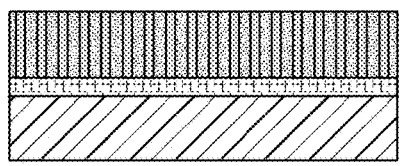
FIG. 1A
FIG. 1B
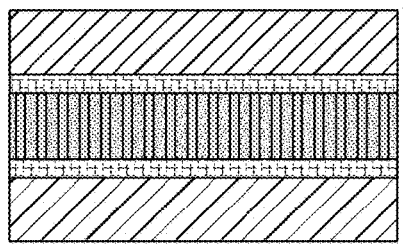
FIG. 1C

HIGH-CONDUCTIVITY BONDING OF METAL NANOWIRE ARRAYS

PRIORITY CLAIM

The present application claims the priority benefit of U.S. provisional patent application No. 62/121,010 filed Feb. 26, 2015 and entitled "Vertically Aligned Metal Nanowire Arrays and Composites for Thermal Management Applications," the disclosure of which is incorporated herein by reference.

CROSS-REFERENCE TO RELATED APPLICATION

This application contains subject matter that is related to the subject matter of the following applications, which are assigned to the same assignee as this application. The below-listed U.S. Patent application is hereby incorporated herein by reference in its entirety:

"THERMAL INTERFACE MATERIALS USING METAL NANOWIRE ARRAYS AND SACRIFICAL TEMPLATES," by Silverman, Starkovich, Peng, Tice, Barako, Coyan, and Goodson, filed on Jan. 26, 2016, U.S. Ser. No. 15/006,597.

SUMMARY

A thermally-conductive and mechanically-robust bonding method for attaching a metal nanowire (MNW) array to an adjacent surface includes the steps of: removing a template membrane from the MNW; infiltrating the MNW with a bonding material; placing the bonding material on the adjacent surface; bringing an adjacent surface into contact with a top surface of the MNW while the bonding material is bondable; and allowing the bonding material to form a solid bond between the MNW and the adjacent surface.

A thermally-conductive and mechanically-robust bonding method for attaching a metal nanowire (MNW) array to an adjacent surface includes the steps of: choosing a bonding material based on a desired bonding process; and without removing the MNW from a template membrane to which the MNW is connected, depositing the bonding material onto a tips of the MNWs.

A metal nanowire (MNW) array includes: a vertically-aligned metal nanowire (MNW) array comprising a plurality of nanowires that grow upward from a seed layer deposited onto a template membrane, the template membrane being removed after MNW growth.

A metal nanowire (MNW) array includes a metal nanowire (MNW) array attached at the MNW tips to an adjacent surface by mushroom-like caps of thermally-conductive and mechanically-robust bonding material.

A metal nanowire (MNW) array includes a metal nanowire (MNW) array attached at the MNW tips to a continuous overplating layer of bonding material covers the template membrane.

DESCRIPTION OF THE DRAWINGS

The accompanying drawings provide visual representations which will be used to more fully describe various representative embodiments and can be used by those skilled in the art to better understand the representative embodiments disclosed herein and their inherent advantages. In these drawings, like reference numerals identify corresponding elements.

FIGS. 1A-1C is a set of three drawings showing a thermally-conductive and mechanically-robust bonding method for attaching a metal nanowire (MNW) array to an adjacent surface.

DETAILED DESCRIPTION

Figure 2:
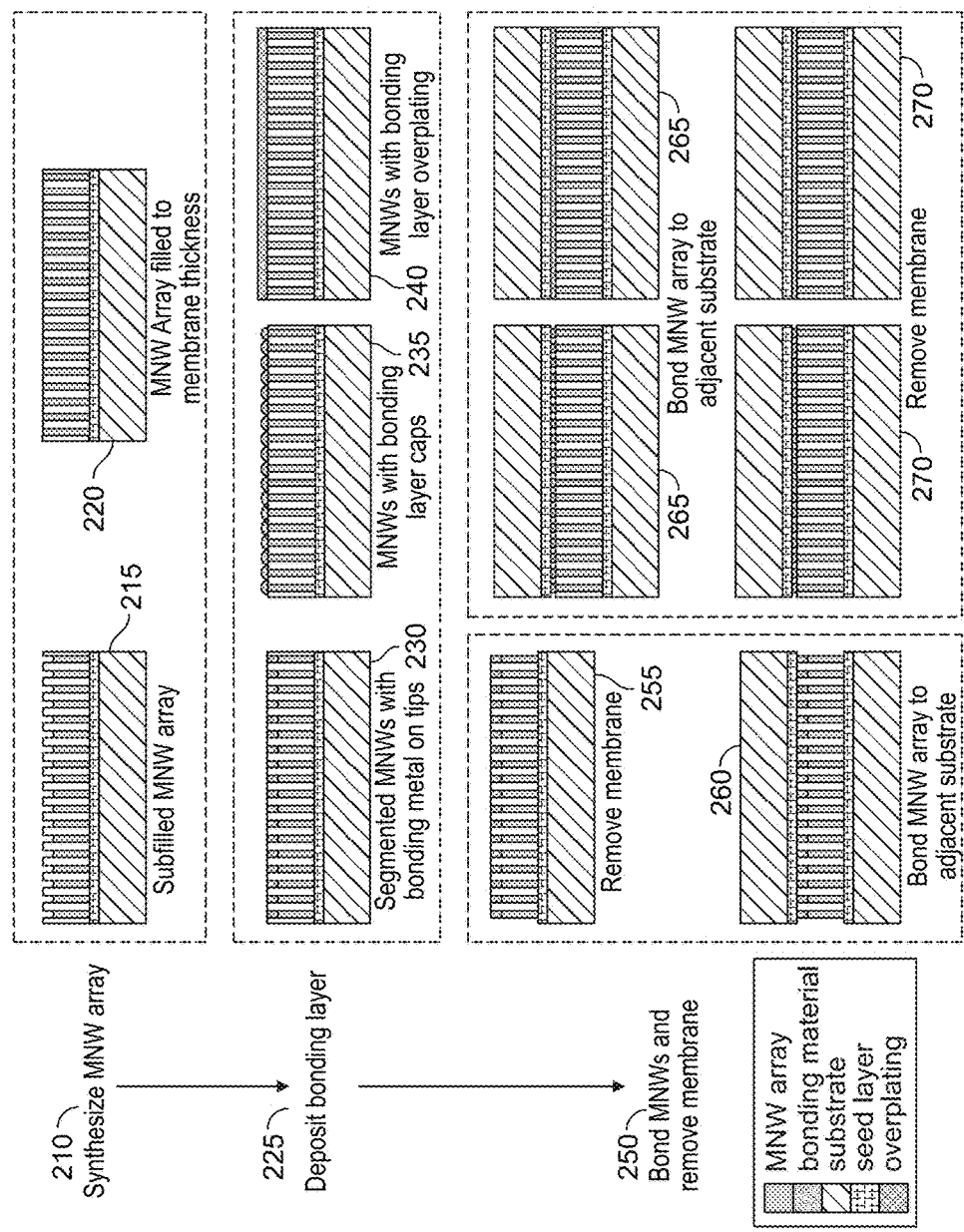
FIG. 2 is a drawing showing a thermally-conductive and mechanically-robust bonding method for attaching a metal nanowire (MNW) array to an adjacent surface.

While the present invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described.

A thermally-conductive and mechanically-robust bonding procedure is provided to attach a metal nanowire (MNW) array to two adjacent surfaces.

A thin metallic bonding layer can be used to anchor the individual MNWs to the adjacent surface without compromising the mechanical properties of the MNW. For example, a thickness of the metallic bonding layer is less than approximately 20% of one or more of the length of the MNW array and the height of the MNW array.

According to embodiments of the invention, metallically-bonded MNW MNWs may be implemented by infiltrating an interstitial volume of the MNW array with a bonding material and using adhesion of the bonding material to the adjacent surfaces as a method of attachment.

Alternatively, the tip of each MNW can be metallically bonded to an adjacent surface using a process that in parallel bonds all of the MNWs in the array. For example, while the MNWs are still in the membrane, a post MNW growth electrodeposition step can be used to deposit mushroom-like caps of bonding metal or alloy material onto the tips of the MNWs. The bonding cap can comprise one or more of a fusible metal and an alloy similar to a solder, a brazing agent or a diffusion bonding metal. An additional bonding layer is added at the top of the MNW.

If the MNWs are not grown to substantially extend to the full thickness of the membrane, then a bonding material can be deposited at the tip of the MNW to form a compound, segmented MNW. The segmented MNW is principally comprised of the conductive material while only a short section, less than 20% of the total MNW length located at the tip of the MNW is composed of the bonding material. If a slightly thicker bonding layer is desired, the electrodeposition of the bonding material can be continued until a continuous overplating layer of bonding material substantially covers the surface of one or more of the membrane and the MNW array. For example, the conductive material comprises one or more of copper and silver.

The bonding material is chosen based on the desired bonding process used. For example, one or more of a eutectic metal and a solder can be used for phase change bonding, where heating is applied to melt and adhere the molten bonding layer to the adjacent surface. Alternatively, the bonding material can be one or more of tin and gold and can be bonded using thermocompressive bonding. Alternatively, the bonding material comprises a polymer material. Other types of metallic bonding include brazing and welding, which can also be used to attach a bonding material at the MNW tips to an adjacent material.

FIGS. 1A-1C is a set of three drawings showing a thermally-conductive and mechanically-robust bonding method for attaching a metal nanowire (MNW) array to an adjacent surface. The legend indicates the various components.

In FIG. 1A, following deposition and growth of the MNWs, the template membrane used in generating the MNWs is removed.

In FIG. 1B, the MNW array is then infiltrated with one or more of a fusible metal, an alloy, and a polymer resin, creating bondable material. For example, the bondable material comprises molten material. For example, the bondable material is wicked by capillary forces into an interstitial volume of the MNW array by capillary forces. Bonding material is then placed on an adjacent surface to the MNW.

In FIG. 1C, an adjacent surface is brought into contact with a top surface of the MNW while the bonding material is bondable. For example, the bondable material comprises molten material. The bonding material is allowed to form a solid bond between the MNW and the adjacent surface. This process compresses one or more of the bonding material and the MNW array against the adjacent surface.

An additional step (not pictured) may be performed of wetting the bonding material to the adjacent surface.

FIG. 2 is a drawing showing a thermally-conductive and mechanically-robust bonding method for attaching a metal nanowire (MNW) array to an adjacent surface. The tips of an MNW array are bonded to an adjacent surface.

In step 210, an MNW array is synthesized. The MNW array is grown to be either subfilled, where the length of the MNWs is less than the membrane thickness, as shown in step 215, or filled to the top of the membrane such that the tips of the MNWs are even with the top surface of the membrane, as shown in step 220. In either case, the membrane is left in place around the MNWs.

In step 225, a bonding layer is deposited onto the tips of the MNWs. This bonding layer can take one of three different forms. As shown in step 230, if the MNW array is subfilled, a small amount of bonding material can be deposited directly onto the tip of each individual MNW, forming a short MNW segment of bonding material.

As shown in step 235, if the MNW array is filled to the membrane thickness, a small amount of bonding material can be deposited onto the tip of each individual MNW, forming a small mushroom-cap of bonding material above each individual MNW.

As shown in step 240, if the MNW array is filled to the membrane thickness, a large amount of bonding material can be deposited onto the surface of the array and membrane to form a continuous film of bonding material.

In step 250, the MNWs are bonded and the template membrane is removed.

In step 255, the template membrane is removed from the previously subfilled MNW array, and then in step 260, the MNW array is bonded to the adjacent substrate.

In step 265, for the embodiments with bonding layer caps or with bonding layer overplating, the MNW array is first bonded to the adjacent substrate. The most common types of metallic bonding are solder/eutectic bonding, where the bonding material comprises one or more of a solder and a eutectic and where bonding is performed under heating and optional compression, and thermocompressive bonding, where the bonding material comprises one or more of tin and gold, and wherein bonding is performed under heating and compression.

Figure 3:
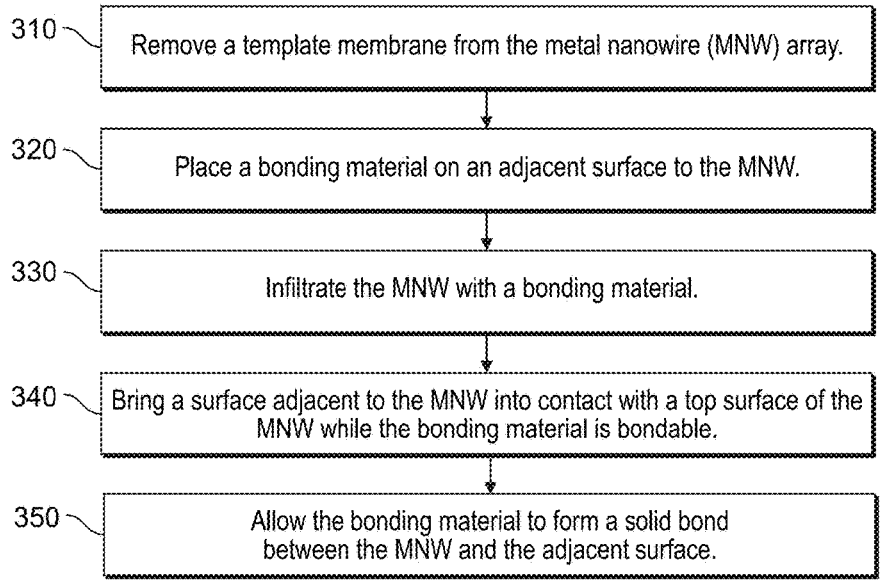
FIG. 3 is a flowchart of a thermally-conductive and mechanically-robust bonding method for attaching a metal nanowire (MNW) array to an adjacent surface.

In step 270, the template membrane is removed from the MNW array. FIG. 3 is a flowchart of a thermally-conductive and mechanically-robust bonding method 300 for attaching a metal nanowire (MNW) array to an adjacent surface.

In step 310, a template membrane is removed from the metal nanowire (MNW) array. Block 310 then transfers control to block 320.

In step 320 a bonding material is placed on an adjacent surface to the MNW. Block 320 then transfers control to block 330.

In step 330 the MNW is infiltrated with a bonding material. For example, the step of infiltrating comprises heating the bonding material so that it becomes one or more of softened and molten. For example, the step of infiltrating comprises chemically treating a composite material so as to create a bonding material. Block 330 then transfers control to block 340.

In step 340, a surface adjacent to the MNW is brought into contact with a top surface of the MNW while the bonding material is bondable. Block 340 then transfers control to block 350.

In block 350, the bonding material is allowed to form a solid bond between the MNW and the adjacent surface. Block 350 then terminates the process.

Figure 4:
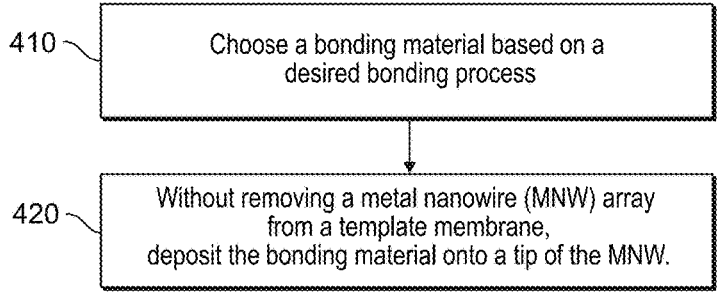
FIG. 4 is a flowchart of a thermally-conductive and mechanically-robust bonding method for attaching a metal nanowire (MNW) array to an adjacent surface.

FIG. 4 is a flowchart of a thermally-conductive and mechanically-robust bonding method 400 for attaching a metal nanowire (MNW) array to an adjacent surface.

In step 410, a bonding material is chosen based on a desired bonding process. Block 410 then transfers control to block 420.

In step 420, without removing a metal nanowire (MNW) array from a template membrane, the bonding material is deposited onto a tip of the MNW. Block 420 then terminates the process.

Advantages of the invention include high thermal conductivity outside of the interfaces and formation of a cohesive joint between the two components. Embodiments of the invention minimize the thermal resistance between the MNW surface and the adjacent surface and provide long-lifetime adhesion that preserves its integrity under temperature gradients and thermal cycling. Fusible metal MNWs are used in applications where the mechanical stresses are comparatively low or for applications where the minimization of device temperature rise (or equivalently for high-heat flux devices) is the priority of the thermal design. For example, the mechanical stresses are less than approximately 20 megapascals (20 MPa).

Fusible metals undergo a phase change during bonding and can provide direct adhesion to adjacent surfaces. However, the resulting MNW must be comparatively thick since the bonding metal is stiff and mismatch in the coefficients of thermal expansion can cause the interface to fail. In vertically-aligned MNWs, the MNWs provide both high thermal conductivity (greater than 20 watts per meter-kelvin [W/m-K]) and mechanical compliance. For example, the mechanical compliance is between approximately 10 megapascals (MPa) and approximately 100 MPa. For example, the mechanical compliance is between approximately 10 MPa and 1,000 MPa. The MNWs themselves provide the mechanical flexibility. The bond serves primarily to transfer heat between the surface and the MNW array and to maintain mechanical integrity of the interface.

While the above representative embodiments have been described with certain components in exemplary configurations, it will be understood by one of ordinary skill in the art that other representative embodiments can be implemented using different configurations and/or different components. For example, it will be understood by one of ordinary skill in the art that the time horizon can be adapted in numerous ways while remaining within the invention.

The representative embodiments and disclosed subject matter, which have been described in detail herein, have been presented by way of example and illustration and not by way of limitation. It will be understood by those skilled in the art that various changes may be made in the form and details of the described embodiments resulting in equivalent embodiments that remain within the scope of the invention. It is intended, therefore, that the subject matter in the above description shall be interpreted as illustrative and shall not be interpreted in a limiting sense.

What is claimed is:

1. A metal nanowire (MNW) array attached at MNW tips to a surface adjacent to the MNW array by thermally-conductive phase change bonding material filling a template membrane on top of the MNW array, wherein the MNW array is partially subfilled within the template membrane, the bonding material consisting of tin, the MNW array consisting of one or more of copper and silver.

* * * * *